(12) United States Patent
Kushiyama et al.

(10) Patent No.: US 7,251,765 B2
(45) Date of Patent: Jul. 31, 2007

(54) SEMICONDUCTOR INTEGRATED CIRCUIT AND METHOD FOR TESTING A SEMICONDUCTOR INTEGRATED CIRCUIT

(75) Inventors: Natsuki Kushiyama, Kawasaki (JP); Yukihiro Urakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 11/001,155

(22) Filed: Dec. 2, 2004

(65) Prior Publication Data

US 2005/0134300 A1 Jun. 23, 2005

(30) Foreign Application Priority Data

Dec. 3, 2003 (JP) .............................. 2003-405085

(51) Int. Cl.
*G01R 31/28* (2006.01)
(52) U.S. Cl. ..................... 714/733; 714/25; 714/30; 714/700; 714/707; 714/716; 714/731; 714/734; 714/744; 713/500; 375/371; 327/158; 702/106
(58) Field of Classification Search ...................... None
See application file for complete search history.

(56) References Cited

U.S. PATENT DOCUMENTS

| | | | | |
|---|---|---|---|---|
| 5,515,403 A | * | 5/1996 | Sloan et al. | 375/371 |
| 6,192,092 B1 | * | 2/2001 | Dizon et al. | 375/371 |
| 6,202,168 B1 | * | 3/2001 | Saito et al. | 713/600 |
| 6,397,042 B1 | * | 5/2002 | Prentice et al. | 455/67.14 |
| 6,448,756 B1 | * | 9/2002 | Loughmiller | 324/76.54 |
| 6,493,829 B1 | * | 12/2002 | Kubo | 713/500 |
| 6,671,847 B1 | * | 12/2003 | Chao et al. | 714/744 |
| 2002/0180500 A1 | * | 12/2002 | Okuda et al. | 327/158 |
| 2003/0177423 A1 | * | 9/2003 | Komatsu et al. | 714/700 |
| 2004/0243899 A1 | * | 12/2004 | Bonneau et al. | 714/733 |
| 2004/0250180 A1 | * | 12/2004 | Hotta | 714/699 |
| 2004/0267479 A1 | * | 12/2004 | Querbach et al. | 702/117 |
| 2005/0052189 A1 | * | 3/2005 | Christensen | 324/622 |

FOREIGN PATENT DOCUMENTS

JP 2000-65902 3/2000

* cited by examiner

*Primary Examiner*—Guy Lamarre
*Assistant Examiner*—John P Trimmings
(74) *Attorney, Agent, or Firm*—Oblon, Spivak, McClelland, Maier & Neustadt, P.C.

(57) ABSTRACT

A semiconductor integrated circuit includes a first delay circuit generating a first delay clock; a second delay circuit generating a second delay clock; a first register registering a value of a first delay of the first delay clock; a second register registering a value of a second delay of the second delay clock; a clock supplying circuit supplying a clock signal to the first and second delay circuits; a phase comparator detecting a phase difference between the first and second delay clocks; and a built-in test circuit configured to control the first and second registers so that the value of the first delay can be registered in the first register and the value of the second delay can be registered in the second register.

18 Claims, 8 Drawing Sheets

A semiconductor integrated circuit 61 shown in FIG. 8 includes an input/output circuit 62, and a phase-locked loop circuit (hereinafter referred to simply as a "PLL") 63. The semiconductor integrated circuit 61 receives inputs of signals. Each of the signals contains data and a clock superimposed thereon through RXP and RXN input terminals 65 and 66. The input terminals 65 and 66 are connected to an external device. The circuit 61 transfers parallel data 73, which is generated by a delay circuit that recovers the phase of the clock.

SEMICONDUCTOR INTEGRATED CIRCUIT AND METHOD FOR TESTING A SEMICONDUCTOR INTEGRATED CIRCUIT

CROSS REFERENCE TO RELATED APPLICATIONS

This application is based upon and claims the benefit of priority from the prior Japanese Patent Applications No. P2003-405085, filed on Dec. 3, 2003; the entire contents of which are incorporated herein by reference.

BACKGROUND OF THE INVENTION

1. Field of the Invention

The invention relates to a semiconductor integrated circuit and a method for testing the same, and more particularly to a semiconductor integrated circuit including a built-in test circuit (i.e., a built-in self test circuit (BIST)) which checks frequencies at which the semiconductor integrated circuit operates, and a method for testing a semiconductor integrated circuit.

2. Description of the Related Art

A semiconductor integrated circuit 61 shown in FIG. 8 includes an input/output circuit 62, and a phase-locked loop circuit (hereinafter referred to simply as a "PLL") 63. The semiconductor integrated circuit 61 receives inputs of signals. Each of the signals contains data and a clock superimposed thereon through RXP and RXN input terminals 65 and 66. The input terminals 65 and 66 are connected to an external device. The circuit 61 transfers parallel data 73, which is generated by a delay circuit that recovers the phase of the clock.

The input/output circuit 62 includes a receiver 67, a clock/data recovery circuit (CDR) 69, a serial-parallel converter (i.e., a serial-in parallel-out converter (SIPO)) 70, a phase comparator (i.e., a phase detector/comparator (PD)) 68 connected to an output of the receiver 67, a delay circuit 71, and a register 72.

A mass production test for the semiconductor integrated circuit 61 involves setting the values of the register 72 to system requirements; changing the phase of the clock transferred from the delay circuit 71; using the phase comparator 68 to compare a clock edge extracted from the input signal to a clock edge transferred from the delay circuit 71; and matching the clock edge transferred from the delay circuit 71 to the clock edge extracted from the input signal, thereby locking the phase.

To test a conventional semiconductor integrated circuit, a test has been performed for the range of frequencies at which the semiconductor integrated circuit operate. The test involves receiving a clock signal of a uniform frequency, and increasing the delay time of a delay line; then changing, in sequence, the logical levels of frequency control signals arranged in parallel; detecting a change to low or high level in an external signal line; and using an external device to check how the semiconductor integrated circuit functions at a specific frequency.

BRIEF SUMMARY OF THE INVENTION

An aspect of the present invention inheres in a semiconductor integrated circuit including a first delay circuit generating a first delay clock; a second delay circuit generating a second delay clock; a first register connected to the first delay circuit to register a value of a first delay of the first delay clock; a second register connected to the second delay circuit to register a value of a second delay of the second delay clock; a clock supplying circuit connected to the first and second delay circuits and supplying a clock signal to the first and second delay circuits; a phase comparator connected to the first and second delay circuits to detect a phase difference between the first and second delay clocks; and a built-in test circuit configured to control the first and second registers so that the value of the first delay can be registered in the first register and the value of the second delay can be registered in the second register.

Another aspect of the present invention inheres in a semiconductor integrated circuit including a first input circuit receiving a first input signal; a second input circuit receiving a second input signal; a first output circuit supplying the first input signal to the first input circuit; a second output circuit supplying the second input signal to the second input circuit; a clock supplying circuit supplying a clock signal through a first delay circuit to the first input circuit and supplying the clock signal through a second delay circuit to the second input circuit; and a built-in test circuit connected to the first and second input circuits and the first and second output circuits to test a phase difference based on a first test result received from the first input circuit and based on a second test result received from the second input circuit.

Still another aspect of the present invention inheres in a method for testing a semiconductor integrated circuit including generating a first delay clock from a first delay circuit; generating a second delay clock from a second delay circuit; storing a value of a first delay of the first delay clock in a first register; storing a value of a second delay of the second delay clock in a second register; supplying a clock signal to the first and second delay circuits from a clock supplying circuit; detecting a phase difference between the first and second delay clocks in a phase comparator; and comparing the phase difference with a test data.

DETAILED DESCRIPTION OF THE INVENTION

Figure 1:
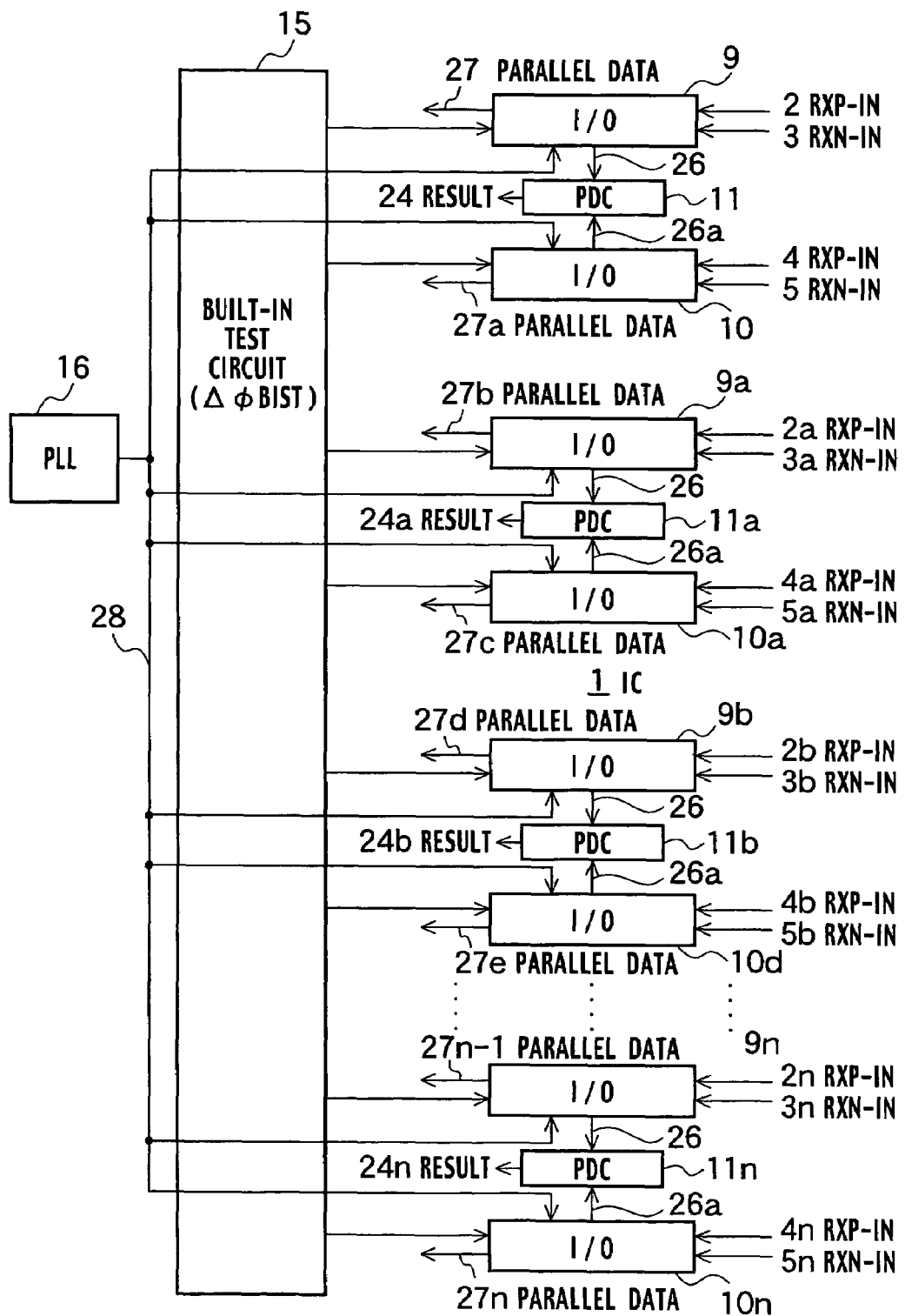
FIG. 1 is a block diagram of a semiconductor integrated circuit according to an embodiment of the invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

EMBODIMENT

FIG. 1 is a block diagram of a semiconductor integrated circuit 1 according to an embodiment of the invention. The semiconductor integrated circuit 1 includes a first input/output circuit 9, a second input/output circuit 10 adjacent to the first input/output circuit 9, and a phase comparator 11 which is connected to the first and second input/output circuits 9 and 10 so as to detect a phase difference between internal delay clocks of the first and second input/output circuits 9 and 10.

The semiconductor integrated circuit 1 further includes a PLL 16 which acts as a clock supply circuit, and a built-in test circuit 15 which supplies test data to change the internal delay clocks of the first and second input/output circuits 9 and 10.

The first input/output circuit 9 receives external signals. Each of the external signals contains data and a clock superimposed thereon through RXP and RXN input terminals 2 and 3. The second input/output circuit 10 receives external signals. Each data and a clock superimposed thereon through RXP and RXN input terminals 4 and 5.

The PLL 16 is connected to the first and second input/output circuits 9 and 10. The PLL 16 supplies a clock signal, which serves as a reference frequency of the internal delay clock of each input/output circuit, at intervals of a predetermined clock cycle. Thus, the PLL 16 generates a delay clock corresponding to the values of a register (not shown).

The built-in test circuit 15 changes the values of the respective registers (not shown) of the first and second input/output circuits 9 and 10, and controls the delay time of the internal delay clocks thereof. Thus, the built-in test circuit 15 tests, in turn, the first and second input/output circuits 9 and 10.

The semiconductor integrated circuit 1 can include input/output circuits 9a to 9n and 10a to 10n, each of which acts as a channel which has data interface features and functions as follows: the channel receives an embedded clock, that is, data and a clock embedded therein, which is transmitted from the transmitting end (not shown); recovers the clock and the data from the embedded clock; and transfers parallel data 27.

Since parallel data 27a, 27b, 27c, 27d, 27e, . . . , 27n-1, and 27n transferred from the input/output circuits are transferred using the identical or equivalent configuration to the configuration used to transfer the parallel data 27, the repeated description thereof is omitted.

When each input/output circuit recovers the clock and the data from the received embedded clock, the PLL 16 may be connected to each channel so as to recover both the frequency and phase of the clock, or a delay circuit (not shown) may be provided in each channel so as to recover only the phase of the clock.

The PLL 16 supplies clocks common to all the channels, and changes the output timing of the clock from the delay circuit (not shown) of each channel so that the edge of the output clock follows the edge of the clock extracted from the embedded clock. Thus, the PLL 16 can match the phase of the output clock from the delay circuit to the phase of the embedded clock.

To change the phase from the delay circuit, an analog mechanism comprising a combination of a charge pump circuit and a low-pass filter may be used. Alternatively a digital mechanism comprising a combination of a register and a phase interpolator which rotates a phase by 360 degrees corresponding to a digital value stored in the register may be used.

In the embodiment, the phase comparator 11 is disposed between adjacent channels. While stepwise changing the phase of the delay clock transferred from the delay circuit of one channel (e.g., the first input/output circuit 9) and, the phase comparator 11 detects the phase of the delay clock transferred from the delay circuit of the other channel (e.g., the second input/output circuit 10). Then, the phase comparator 11 transfers a built-in test result 24. This operation enables a test to be performed to determine whether or not the delay circuits of both the channels function normally.

In the same manner, a phase comparator 11a is disposed between a pair of the input/output circuits 9a and 10a. The phase comparator 11a detects the phase of the delay clock from the input/output circuit 10a, while stepwise changing the phase of the delay clock from the input/output circuit 9a. Then, the phase comparator 11a transfers a built-in test result 24a. This operation enables a test to be performed to determine whether or not the delay circuits of both the channels function normally.

Furthermore, a phase comparator 11b is disposed between the input/output circuits 9b and 10b, arranged as a pair, and a phase comparator 11n is disposed between the input/output circuits 9n and 10n arranged, in a pair. The phase comparators 11b and 11n detect the phases of the delay clocks from the input/output circuits 10b and 10n, respectively, while stepwise changing the phases of the delay clocks from the input/output circuits 9b and 9n, respectively. Then, the phase comparators 11b and 11n transfer built-in test results 24b and 24n, respectively. This operation enables a test to be performed to determine whether or not the delay circuit of each channel functions normally.

The above-discussed built-in test result 24 may be transferred to an external device through a terminal (not shown), or may be temporarily stored in the built-in test circuit 15 and be transferred to the external device through the terminal after a lapse of a predetermined time. An arrangement is provided so that the external device can read out the built-in test result 24, 24a, 24b, or 24c at a predetermined time so as to determine whether the semiconductor integrated circuit 1 is defective or not.

FIRST EXAMPLE

Figure 2:
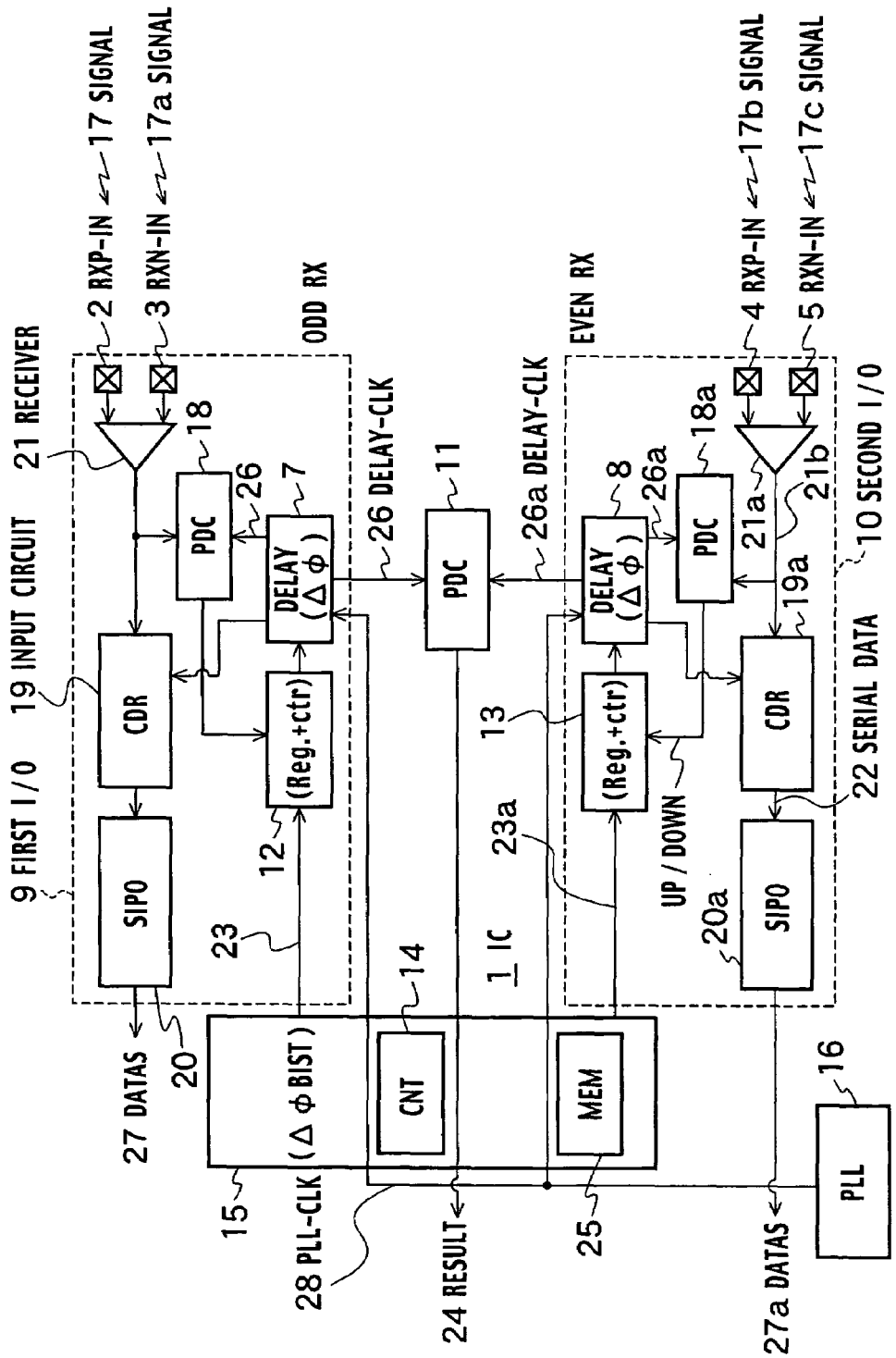
FIG. 2 is a block diagram of a semiconductor integrated circuit according to a first example of the invention.

FIG. 2 is a block diagram of the semiconductor integrated circuit 1 according to a first example of the invention. The circuit shown in FIG. 2 is an interface part of the semiconductor integrated circuit 1 including the first input/output circuit 9, the second input/output circuit 10, the phase comparator 11, the built-in test circuit (Δ φ BIST) 15, and the PLL 16.

The semiconductor integrated circuit 1 includes a plurality of input/output circuits (RX) 9 and 10 which operate at high speed. Each of the circuits 9 and 10 receives the PLL clock 28 transferred from the PLL 16. The semiconductor integrated circuit 1 receives external signals 17 and 17a. Each of the signals 17 and 17c contains data and a clock superimposed thereon, which are transmitted from an output circuit (TX) of the transmitting end (not shown), through the RXP and RXN input terminals 2 and 3, respectively, of the first input/output circuit 9.

The second input/output circuit 10 has the identical or equivalent features to the features of the first input/output circuit 9, in that the second input/output circuit 10 receives external signals 17b and 17c. Each of the signals 17b and 17c contains data and a clock superimposed thereon, which are transmitted from the output circuit (TX) of the transmitting end, through the RXP and RXN input terminals 4 and 5, respectively. For a clear description of the configuration, the detailed description is given below with regard to an interface between RX and TX by referring to the first input/output circuit 9.

The first input/output circuit 9 includes a receiver 21 which is connected to the RXP and RXN input terminals 2 and 3 so as to act as a differential input circuit, a CDR 19 which is connected to an output of the receiver 21 so as to act as an input circuit, and a SIPO 20 connected to an output of the CDR 19.

The first input/output circuit 9 further includes a phase comparator (PD) 18 connected to the output of the receiver 21, a register (Reg+ctr) 12 connected to an output of the phase comparator 18, and a delay circuit (Δϕ) 7 connected to an output of the register 12. These structural components constitute an interface part of a digital delay-locked loop (DLL) that permits the delay circuit 7 to transfer a delay clock corresponding to a value stored in the register 12.

A description is given of the operation of the semiconductor integrated circuit 1 with reference to the block diagram of FIG. 2. The first input/output circuit 9 extracts clock phase information from the received external signals 17 and 17a, and samples input data in accordance with an internal clock for the phase.

The output circuit (TX) of the transmitting end includes elements for superimposing data and a clock, such as an "8b10b" encoding circuit. Data encoded by the output circuit (TX) undergoes a change in superimposed data once every at least five cycles, for example. However, the invention is not limited to this configuration, and data may be changed once every ten cycles.

The delay circuit 7 of the first input/output circuit 9 receives the input of a clock from the PLL 16. Upon receipt of the clock, the delay circuit 7 generates any given phase clock by delaying the phase of the clock supplied by the PLL 16 in accordance with an integral value stored in the register 12.

The phase comparator 18 in the first input/output circuit 9 compares the phase of an output clock from the receiver 21 to the phase of an output clock from the delay circuit 7. When the phase of the output clock from the delay circuit 7 leads the phase of the output clock from the receiver 21, the phase comparator 18 sends a count up/down signal to the register 12 so as to increment the register 12 and thus delay by one step the phase of the output clock from the delay circuit 7.

When the phase of the output clock from the delay circuit 7 lags the phase of the output clock from the receiver 21, the phase comparator 18 sends a count up/down signal to the register 12 so as to decrement the register 12 and thus advance by one step the phase of the output clock from the delay circuit 7. The phase comparator 18 can match the phase of the output clock from the receiver 21 to the phase of the output clock from the delay circuit 7 by repeatedly incrementing or decrementing the clock as mentioned above.

A test for the first input/output circuit 9 of the semiconductor integrated circuit 1 can be performed in the following manner. A semiconductor tester transmits a signal containing data and a clock superimposed thereon to the first input/output (RX) circuit 9 of the semiconductor integrated circuit 1. Then, the semiconductor tester checks the parallel data 27 transferred from the first input/output circuit 9 so as to determine whether the semiconductor integrated circuit 1 can correctly recover data.

During normal operation, the semiconductor integrated circuit 1 functions so that the receiver 21 amplifies differential input signals RXP and RXN, which are the external signals received through the RXP and RXN input terminals 2 and 3, respectively. The semiconductor integrated circuit 1 also functions so as to guide the output clock from the receiver 21 to the phase comparator 18 and the CDR 19 which acts as the input circuit.

The delay circuit 7 generates any given phase clock by delaying the phase of a reference clock supplied by the PLL 16 in accordance with an integral value stored in the register 12.

The phase comparator 18 compares the phase of the output clock from the receiver 21 to the phase of the output clock from the delay circuit 7. When the phase of the output clock from the delay circuit 7 leads the phase of the output clock from the receiver 21, the phase comparator 18 increments the register 12 and thus delays by one step the phase of the output clock from the delay circuit 7.

When the phase of the output clock from the delay circuit 7 lags the phase of the output clock from the receiver 21, the phase comparator 18 decrements the register 12 and thus advances by one step the phase of the output clock from the delay circuit 7. The phase comparator 18 can match the phase of the output clock from the receiver 21 to the phase of the output clock from the delay circuit 7 by repeatedly incrementing or decrementing the clock as mentioned above.

The CDR 19 samples data from an output signal from the receiver 21 in synchronization with the output clock from the delay circuit 7, and transfers serial data to the next-stage SIPO 20. The SIPO 20 can convert the received serial data into parallel data so that the first input/output circuit 9 can output the parallel data.

In the first example, the common built-in test circuit 15 and phase comparator 11 are provided for two channels of the input/output circuits (RX). To test the semiconductor integrated circuit 1, the following operation takes place. When the built-in test circuit 15 sets the register 12 of the odd-numbered RX input/output circuit to a register value 23 (e.g., "5") indicating the value of delay, the output clock from the delay circuit 7 lags in its phase by a value equivalent to the register value "5".

The built-in test circuit 15 sets a register 13 of the even-numbered RX input/output circuit to a value (e.g., "3"), which is less than "5". Then, the phase comparator 11 compares the phase of a delay clock 26 from the delay circuit 7 of the odd-numbered RX input/output circuit to the phase of a delay clock 26a from a delay circuit 8 of the even-numbered RX input/output circuit. In this case, a code indicating the result of comparison "the phase of the delay clock 26a from the delay circuit 8 of the even-numbered RX input/output circuit leads the phase of the delay clock 26 from the delay circuit 7 of the odd-numbered RX input/output circuit" is stored in a memory area (MEM) 25 in the built-in test circuit 15.

While maintaining the register 12 of the odd-numbered RX input/output circuit at "5", the built-in test circuit 15 then changes the register 13 of the even-numbered RX input/output circuit from "3" to "4". That is, the register value 23 indicating the value of delay, which is transferred from a controller 14. Then, the phase comparator 11 compares the phase of the delay clock 26 from the delay circuit 7 of the odd-numbered RX input/output circuit to the phase of the delay clock 26a from the delay circuit 8 of the even-numbered RX input/output circuit.

Although the phase comparator 11 should transfer the built-in test result 24 "the phase of the delay clock 26a from the delay circuit 8 of the even-numbered RX input/output circuit leads the phase of the delay clock 26 from the delay circuit 7 of the odd-numbered RX input/output circuit", the phase comparator 11 has a dead zone. More specifically, the phase comparator 11 transfers an accurate result of comparison only when the phase of the delay clock from the delay circuit of the odd-numbered RX input/output circuit is somewhat distant from the phase of the delay clock from the delay circuit of the even-numbered RX input/output circuit.

In this case, it appears that the phase comparator 11 transfers the erroneous built-in test result 24 "the phase of the delay clock 26 from the delay circuit 7 of the odd-numbered RX input/output circuit leads the phase of the delay clock 26a from the delay circuit 8 of the even-numbered RX input/output circuit", because a phase difference between the delay clocks 26 and 26a from the delay circuits 7 and 8 of the odd-numbered RX and even-numbered RX input/output circuits is no more than "1" in terms of the register value. While maintaining the register 12 of the odd-numbered RX input/output circuit, the phase comparator 11 continues performing phase comparison until the register 13 of the even-numbered RX input/output circuit reaches "7".

For example, when the register 13 of the even-numbered RX input/output circuit has the register value "3", the phase comparator 11 transfers the correct built-in test result 24 "the phase of the delay clock 26a from the delay circuit 8 of the even-numbered RX input/output circuit leads the phase of the delay clock 26 from the delay circuit 7 of the odd-numbered RX input/output circuit". When the register 13 has any register value between "4" and "7" inclusive, the phase comparator 11 transfers the built-in test result 24 "the phase of the delay clock 26 from the delay circuit 7 of the odd-numbered RX input/output circuit leads the phase of the delay clock 26a from the delay circuit 8 of the even-numbered RX input/output circuit".

It appears that although the phase comparator 11 makes a correct determination when the register 13 has the register value "7", the phase comparator 11 makes a determination within the dead zone and transfers the result of determination when the register 13 has any of the other register values "4", "5", and "6". In this case, the width of the dead zone ranges between the center of the dead zone and a predetermined register value. For example, the margin of the dead zone can be set to "plus or minus 1" in terms of the register value so that the width of the dead zone can be specified within this range.

In the first example, phase comparison takes place in a region other than the dead zone and thus yields the correct built-in test result 24. When phase comparison takes place in a region other than the dead zone (i.e., at the register values "3" and "7") and thus yields the correct built-in test result 24, the built-in test circuit 15 can determine (or estimate) that "the register 13 and the delay circuit 8 of the even-numbered RX input/output circuit operate correctly at the register value "5"".

The built-in test result 24 may be transferred to an external device through a terminal (not shown), or may be temporarily stored in the built-in test circuit 15 and be transferred to the external device through the terminal after a lapse of a predetermined time.

The controller (CNT) 14 acts as a control mechanism which repeatedly performs the above-discussed operation for incrementing the register so that the register 12 of the odd-numbered RX input/output circuit has varying values between the minimum value (the initial value) and the maximum value (the final value). Thus, the built-in test circuit 15 can determine (or estimate) that "the register 13 and the delay circuit 8 of the even-numbered RX input/output circuit operate correctly at all register values".

After the control mechanism has completed the processing on the odd-numbered RX input/output circuit by using the even-numbered RX input/output circuits, the controller 14 repeats the processing on the even-numbered RX by using the odd-numbered RX input/output circuits. Thus, the built-in test circuit 15 can determine (or estimate) that "the register 12 and the delay circuit 7 of the odd-numbered RX input/output circuit operate correctly at all register values".

The semiconductor integrated circuit 1 can sequentially transfer the built-in test results 24 to an external device through a terminal (not shown) so as to check whether the circuit 1 is defective or not. Alternatively, the semiconductor integrated circuit 1 can cause the built-in test circuit 15 to temporarily store the built-in test result 24, which is read out by an external device after a lapse of a predetermined time so as to check whether the circuit 1 is defective or non-defective.

Since structural components of the even-numbered RX second input/output circuit 10, such as a phase comparator 18a, a receiver 21a, an input circuit (CDR) 19a, a SIPO 20a, a receiver output 21b, serial data 22, and parallel data 27a, have the identical or equivalent configuration to the structural components of the odd-numbered RX first input/output circuit 9, the description thereof is omitted.

Although a correct determination cannot be made when the registers or the delay circuits of both the adjacent even-numbered RX and odd-numbered RX input/output circuits malfunction simultaneously, such a situation is unlikely to arise. The mass production test for the semiconductor integrated circuit of the embodiment can determine, with higher reliability than the prior art, that the registers or the delay circuits of both the even-numbered RX and odd-numbered RX input/output circuits operate correctly, provided only that the semiconductor integrated circuit passes a series of tests of the mass production test.

Therefore, the embodiment enables a test for an interface unit of a semiconductor integrated circuit without the use of an expensive high-speed semiconductor tester, and thus reduces the cost of manufacturing the semiconductor integrated circuit.

SECOND EXAMPLE

Figure 3:
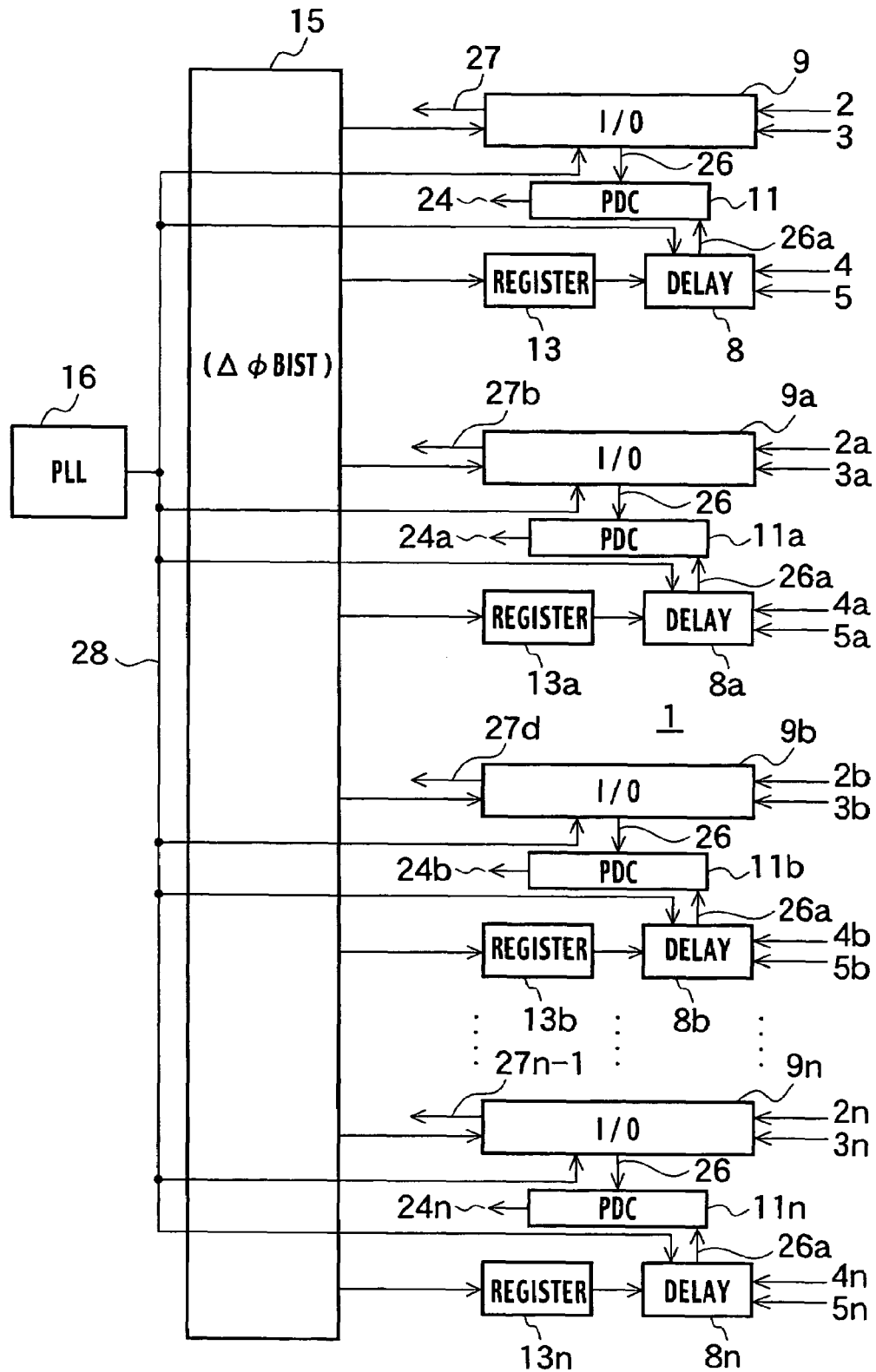
FIG. 3 is a block diagram of a semiconductor integrated circuit according to a second example of the invention.

FIG. 3 is a block diagram of the semiconductor integrated circuit 1 according to a second example of the invention. The circuit shown in FIG. 3 is an interface part of the semiconductor integrated circuit 1 including a plurality of input/output circuits 9, 9a, 9b, . . . , and 9n, a plurality of phase comparators 11, 11a, 11b, . . . , and 11n, a plurality of registers 13, 13a, 13b, . . . , and 13n, a plurality of delay circuits 8, 8a, 8b, . . . , and 8n, a built-in test circuit (ΔϕBIST) 15, and a PLL 16.

Since the input/output circuits 9, 9a, 9b, . . . , and 9n can have the same configuration as the input/output circuit of the first example, the repeated description thereof is omitted.

In the semiconductor integrated circuit 1, the phase comparator 11, the delay circuit 8, and the register 13 which controls the delay circuit 8 are assigned to one channel of the first input/output circuit 9, and the PLL 16 supplies a PLL clock to the first input/output circuit 9 and the delay circuit 8.

The same channels are assigned to the input/output circuits 9a, 9b, . . . , and 9n and thus constitute a multi-channel interface part. The built-in test circuit 15 is connected to each of the input/output circuits 9, 9a, 9b, . . . , and 9n and each of the registers 13, 13a, 13b, . . . , and 13n so as to transmit a register value indicating the value of delay of a delay clock to each input/output circuit and each register.

To test the semiconductor integrated circuit 1, the built-in test circuit 15 transmits the register value indicating the value of delay of an internal delay clock of the first input/output circuit 9 so as to lock the phase of the delay clock.

Concurrently, the built-in test circuit 15 transmits a predetermined register value to the register 13 so as to change the values of the register 13. For example, the built-in test circuit 15 sets the values of the register 13 so that a delay clock transferred from the delay circuit 8 lags the internal delay clock of the first input/output circuit 9.

Then, the phase comparator 11 compares the phase of the internal delay clock of the first input/output circuit 9 to the phase of the delay clock from the delay circuit 8, and transfers the built-in test result 24 indicating that "the phase of the internal delay clock of the first input/output circuit 9 leads the phase of the delay clock from the delay circuit 8". The built-in test result 24 may be transferred to an external device through a terminal (not shown), or may be temporarily stored in the built-in test circuit 15 and be transferred to the external device through the terminal after a lapse of a predetermined time.

The test goes to a next step. While maintaining the phase of the internal delay clock 26 of the first input/output circuit 9 when the value of the delay of the internal delay clock 7 is fixed, the built-in test circuit 15 changes the values of the register 13 until the value of the delay of the internal delay clock 8 is a final value. Then, the phase comparator 11 compares the phase of the internal delay clock 26 of the first input/output circuit 9 to the phase of the delay clock 26a from the delay circuit 8.

The phase comparator 11 has a dead zone as in the case of the first example. The built-in test circuit 15 stores the dead zone therein. Thus, when the phase comparator 11 performs phase comparison in a region other than the dead zone and transfers a normal built-in test result, the built-in test circuit 15 can estimate that one channel of the semiconductor integrated circuit 1 functions correctly.

The identical or equivalent features to the features of the first input/output circuit 9 constituting the above-discussed channel are applied to the other input/output circuits 9a, 9b, . . . , and 9n. This allows the built-in test circuit 15 to simultaneously test the multi-channel interface part, and thus permits simplification of the process for testing the semiconductor.

Therefore, the embodiment enables a test for a semiconductor integrated circuit which includes the interface part without the use of an expensive high-speed semiconductor tester, and thus reduces the cost of manufacturing the semiconductor integrated circuit.

Figure 4:
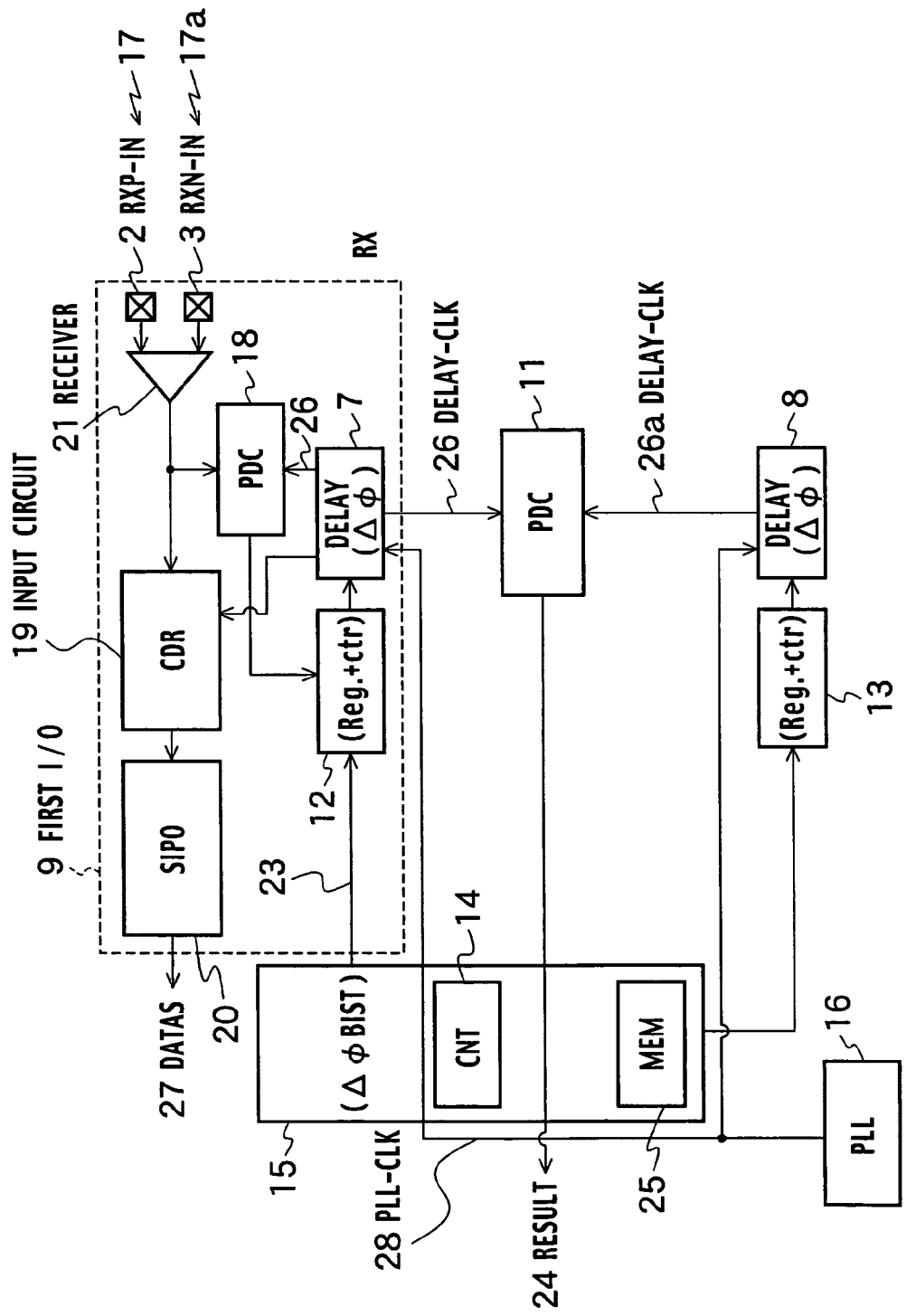
FIG. 4 is a block diagram of the semiconductor integrated circuit according to the second example of the invention.

FIG. 4 is a block diagram of a channel part for use in the second example of the invention. Since the first input/output circuit 9 of the channel part shown in FIG. 4 can have the same configuration as the first input/output circuit 9 of the first example, the description thereof is omitted. In short, the first input/output circuit 9 receives input of signals through the RXP and RXN input terminals 2 and 3, samples data from the signals via the receiver 21, the CDR 19, and the SIPO 20, and transfers the parallel data 27.

The channel part includes the first input/output circuit 9, the phase comparator 11, the register 13, the delay circuit 8, the PLL 16, and the built-in test circuit 15. The PLL 16 supplies the PLL clock 28 to the delay circuit 7 disposed inside the first input/output circuit 9 and the delay circuit 8 disposed outside the first input/output circuit 9.

The built-in test circuit 15 transmits a register value indicating the value of delay to the registers 12 and 13 so as to change the values of each register. The phase comparator 11 compares the phase of the delay clock 26 from the delay circuit 7 to the phase of the delay clock 26a from the delay circuit 8, and transfers the built-in test result 24 indicating the result of comparison. The built-in test result 24 may be transferred to an external device through a terminal (not shown), or may be temporarily stored in the built-in test circuit 15 and be transferred to the external device through the terminal after a lapse of a predetermined time.

For example, at the time of the test, the built-in test circuit 15 sets the register 13, which controls the delay circuit 8, to a predetermined value (e.g., "5") so that the phase of the delay clock 26a lags the phase of the PLL clock 28 by a value equivalent to the register value "5".

The built-in test circuit 15 also sets the register 12 of the first input/output circuit 9 to a value (e.g., "3"), which is less than "5". By using this set parameter, the phase comparator 11 compares the phase of the delay clock 26 from the delay circuit 7 to the phase of the delay clock 26a from the delay circuit 8.

The phase comparator 11 transfers the built-in test result 24 indicating the result of the comparison "the phase of the clock from the input/output circuit leads the phase of the clock from the PLL", and then the built-in test result 24 is stored in the memory area 25 in the built-in test circuit 15. While maintaining the register 13 at "5", the built-in test circuit 15 then increments the register 12 of the first input/output circuit 9 to "4".

Subsequently, the phase comparator 11 compares the phase of the delay clock 26 to the phase of the delay clock 26a. The phase comparator 11 should transfer the result of the comparison "the phase of the clock from the input/output circuit leads the phase of the clock from the PLL". Due to the above-discussed dead zone, the phase comparator 11, however, may not transfer a correct result of comparison when the phase of the delay clock 26 takes some degrees from the phase of the delay clock 26a.

In this case, it appears that the phase comparator 11 transfers an erroneous built-in test result 24 "the phase of the clock from the PLL leads the phase of the clock from the input/output circuit", because a phase difference between the delay clocks 26 and 26a is no more than "1" in terms of the register value. While maintaining the register 13 on the PLL side, the phase comparator 11 continues performing phase comparison until the register 12 in the first input/output circuit 9 reaches "7".

For example, when the register 12 in the first input/output circuit 9 has the register value "3", the phase comparator 11 transfers the correct built-in test result 24 "the phase of the clock from the input/output circuit leads the phase of the clock from the PLL". When the register 12 has any register value between "4" and "7" inclusive, the phase comparator 11 transfers the built-in test result 24 "the phase of the clock from the PLL leads the phase of the clock from the input/output circuit".

It appears that although the phase comparator 11 makes a correct determination when the register 12 has the register value "7", the phase comparator 11 makes a determination within the dead zone and transfers the determination result when the register 12 has any of the other register values "4", "5", and "6". In this case, the width of the dead zone ranges between the center of the dead zone and a predetermined register value. For example, the margin of the dead zone can be set to "plus or minus 1" in terms of the register value so that the width of the dead zone can be specified within this range.

In the second example, phase comparison takes place in a region other than the dead zone and thus yields the correct built-in test result 24. When phase comparison takes place in a region other than the dead zone (i.e., at the register values "3" and "7") and thus yields the correct built-in test result 24, the built-in test circuit 15 determines (or estimates) that "the register 12 and the delay circuit 7 of the first input/output circuit 9 operate correctly at the register value "5"".

The controller (CNT) 14 acts as the control mechanism which repeatedly performs the above-discussed operation for incrementing the register so that the register 12 of the first input/output circuit 9 has varying values between the minimum value (the initial value) and the maximum value (the final value). Thus, the built-in test circuit 15 can determine (or estimate) that "the register 12 and the delay circuit 7 of the first input/output circuit 9 operate correctly at all register values".

The semiconductor integrated circuit 1 can sequentially transfer the built-in test results 24 to an external device through a terminal (not shown) so as to check whether the circuit 1 is defective or not. Alternatively, the semiconductor integrated circuit 1 can instruct the built-in test circuit 15 to temporarily store the built-in test result 24, which is read out by the external device after a lapse of a predetermined time so as to check whether the circuit 1 is defective or non-defective.

As described above, the phase comparator 11, the delay circuit 8, and the register 13 are provided in a region adjacent to the first input/output circuit 9. With only this arrangement, the mass production test for the semiconductor integrated circuit of the embodiment can determine, with higher reliability than the prior art, that the register 12 or the delay circuit 7 of the first input/output circuit 9 operates correctly, provided only that the semiconductor integrated circuit passes a series of tests of the mass production test.

Therefore, the embodiment provides a test for a semiconductor integrated circuit including the interface part without the use of an expensive high-speed semiconductor tester, and thus reduces in the cost of manufacturing the semiconductor integrated circuit.

THIRD EXAMPLE

Figure 5:
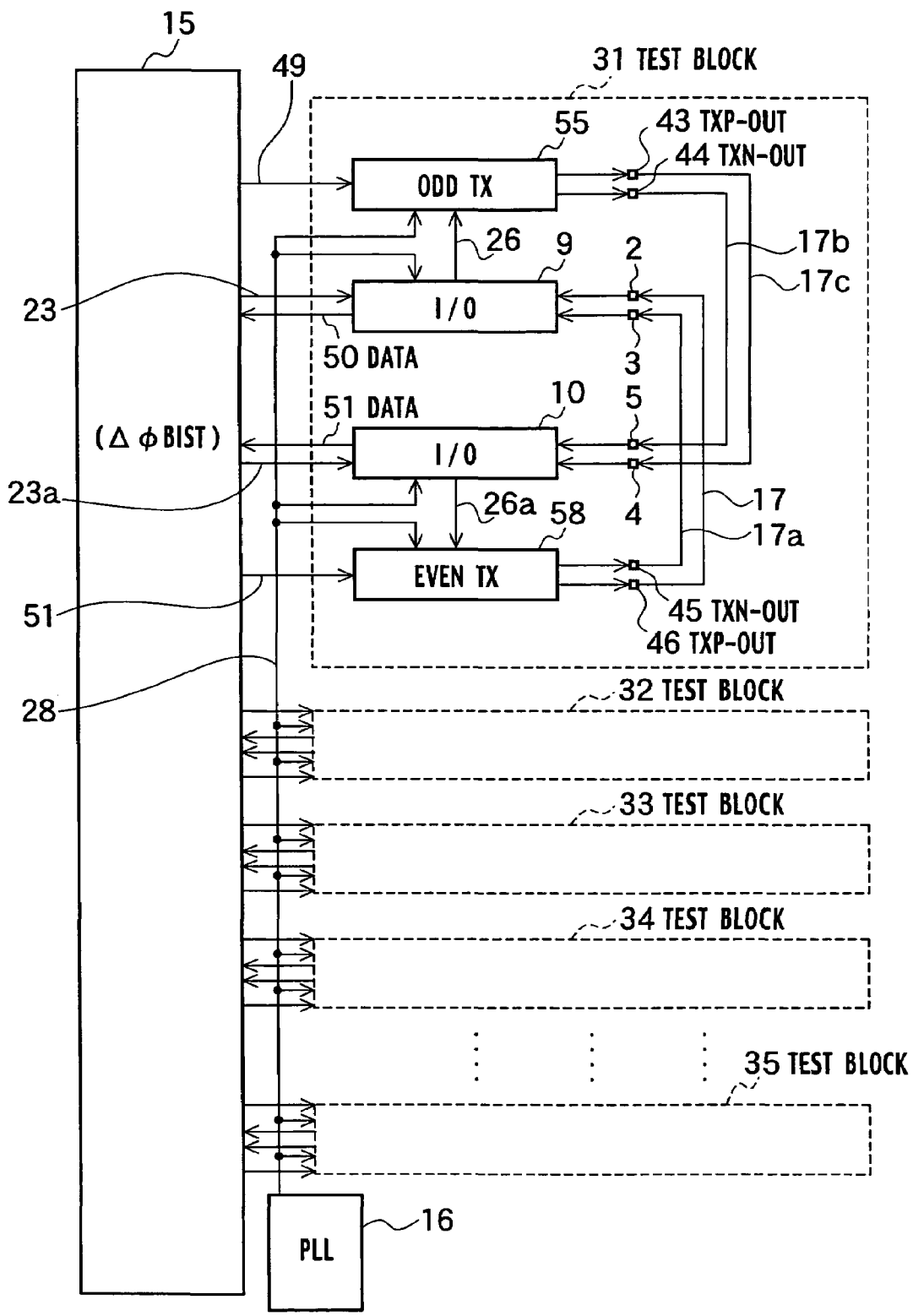
FIG. 5 is a block diagram of a semiconductor integrated circuit according to a third example of the invention.

FIG. 5 is a block diagram of a semiconductor integrated circuit according to a third example of the invention. The semiconductor integrated circuit includes test blocks 31 to 35, a built-in test circuit 15, and a PLL 16.

The test block 31 includes a first input/output circuit 9, an input/output circuit 10, an odd-numbered TX output circuit 55, and an even-numbered TX output circuit 58. TXP and TXN output terminals 43 and 44 of the odd-numbered TX output circuit 55 are electrically connected, on the outside of a chip, to RXP and RXN input terminals 4 and 5, respectively, of the even-numbered RX input/output circuit 10.

The odd-numbered TX output circuit 55 transfers serial data to the even-numbered RX input/output circuit 10 from externally of the outside of the chip. The built-in test circuit 15 is connected to the odd-numbered TX output circuit 55 and the even-numbered RX input/output circuit 10, and the TX output circuit 55 transmits data containing a predetermined phase superimposed thereon, which is set by the built-in test circuit 15.

The built-in test circuit 15 stores therein parallel data transmitted to the TX output circuit 55. The built-in test circuit 15 compares the stored parallel data to parallel data 51 received from the input/output circuit 10 set in a normal operation mode so as to determine whether or not the stored parallel data matches the parallel data 51.

When the built-in test circuit 15 determines that a match occurs, the built-in test circuit 15 can determine that a delay clock of the TX output circuit 55 allows the input/output circuit 10 to properly capture the parallel data. When a mismatch occurs, the built-in test circuit 15 determines that the input/output circuit 10 or the TX output circuit 55 malfunctions.

The built-in test circuit 15 changes the phase of the superimposed data of the TX output circuit 55 so that the phase has varying values between the minimum value (the initial value) and the maximum value (the final value). Then, the built-in test circuit 15 determines whether or not the input/output circuit 10 properly captures data containing each phase superimposed thereon, according to whether or not a parallel data match occurs as discussed above. When a match occurs for all phases, the built-in test circuit 15 can perform a functional test so as to determine whether the input/output circuit 10 properly captures the parallel data in all phase planes.

The semiconductor integrated circuit can concurrently perform the same functional test on the test blocks 32 to 35, besides the test block 31. Specifically, the functional test involves supplying to the test blocks 32 to 35 a reference clock from the common PLL 16 connected to the test blocks 32 to 35, thereby producing a predetermined phase delay; driving the TX circuit and the RX input/output circuit; and checking transmitted and received data. Thus, the test can be accomplished over all phases although the test is simple.

Furthermore, the same functional test can be, of course, repeatedly performed on the even-numbered TX output circuit 58 and the odd-numbered RX first input/output circuit 9 shown in FIG. 5 so as to check parallel data for all phases.

Figure 6:
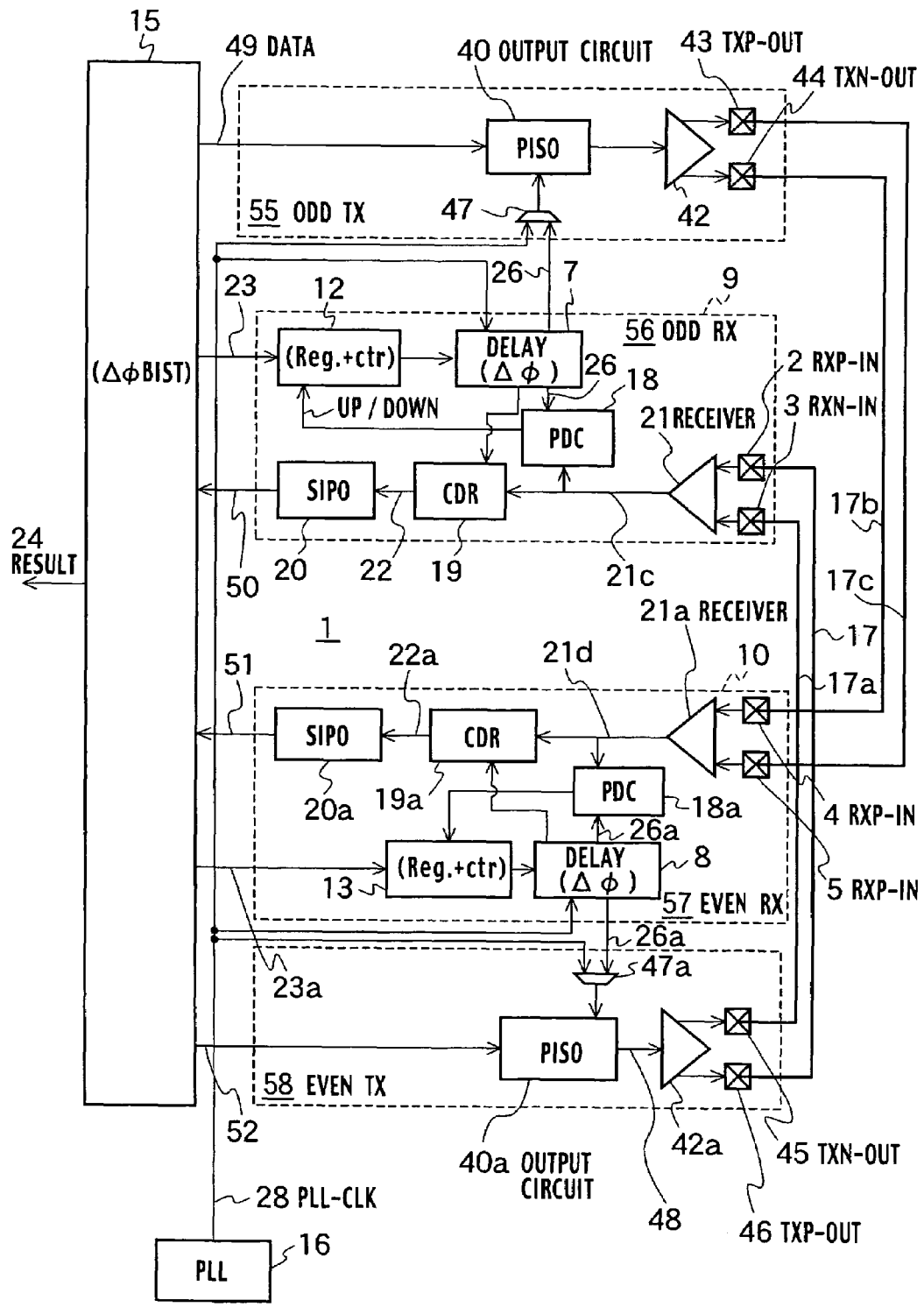
FIG. 6 is a block diagram of the semiconductor integrated circuit according to the third example of the invention.

FIG. 6 is a block diagram of an interface part of the semiconductor integrated circuit 1 according to the third example of the invention. The semiconductor integrated circuit 1 includes the first input/output circuit 9, the input/output circuit 10, the odd-numbered TX output circuit 55, the even-numbered TX output circuit 58, the built-in test circuit 15, and the PLL 16.

The odd-numbered TX output circuit 55 includes a parallel-in serial-out converter (hereinafter referred to simply as a "PISO") 40 which acts as an output circuit which receives parallel data 49 from the built-in test circuit 15, a selector 47 which selects a drive clock of the PISO 40, and a driver 42 connected to an output of the PISO 40.

The even-numbered TX output circuit 58 includes a PISO 40a which acts as an output circuit which receives parallel data 52 from the built-in test circuit 15, a selector 47a which selects a drive clock of the PISO 40a, and a driver 42a connected to an output of the PISO 40a.

Since the first input/output circuit 9 of an odd-numbered RX 56 and the input/output circuit 10 of an even-numbered RX 57 can have the same configuration as the input/output circuits 9 and 10 of the first and second examples, the repeated description thereof is omitted.

A description is given of the operation of the semiconductor integrated circuit 1 with reference to the block diagram of FIG. 6. The interface part shown in FIG. 6 receives or transfers serial data using two pairs of interfaces comprising a pair of the input circuit of the odd-numbered RX 56 and the even-numbered TX output circuit 58 and a pair of the input circuit of the even-numbered RX 57 and the odd-numbered TX output circuit 55.

During normal operation, the first input/output circuit 9 receives input of differential input signals through the input terminals 2 and 3, and the receiver 21 amplifies the differential input signals. The CDR 19 receives a receiver output 21c from the receiver 21, and transfers serial input data 22 to the SIPO 20 in synchronization with a delay clock from the delay circuit 7. The SIPO 20 outputs parallel data 50 to a next stage.

The delay circuit 7 in the first input/output circuit 9 generates any given phase clock by delaying the phase of the PLL clock 28 in accordance with an integral value held by the register 12. Then, the delay circuit 7 supplies the delay clock to the phase comparator 18, the CDR 19, and the selector 47.

The phase comparator 18 compares the phase of the receiver output 21c to the phase of the delay clock. For example when the phase comparator 18 detects that the phase of the delay clock leads the phase of the receiver output 21c, the values of the register 12 are changed so as to increment the register 12 and thus delay by one step the phase of the delay clock from the delay circuit 7.

When the phase comparator 18 detects that the phase of the delay clock lags the phase of the receiver output 21c, the values of the register 12 are changed so as to decrement the register 12 and thus advance by one step the phase of the delay clock from the delay circuit 7.

The operation for changing the values of the register is repeatedly performed using a count up/down signal in accordance with phase comparison performed by the phase comparator 18. This operation allows matching the phase of the receiver output 21c to the phase of the delay clock from the delay circuit 7, so that the CDR 19 can accurately sample data of the receiver output 21c in accordance with the delay clock.

During normal operation, the input/output circuit 10 receives input of differential input signals through the input terminals 4 and 5, and the receiver 21a amplifies the differential input signals. The CDR 19a receives a receiver output 21d from the receiver 21a, and transfers serial input data 22a to the SIPO 20a in synchronization with a delay clock from the delay circuit 8. The SIPO 20a transfers parallel data 51 to a next stage.

The input/output circuit 10 uses the input terminals 4 and 5, the delay circuit 8, the register 13, the receiver 21a, the phase comparator 18a, and the CDR 19a to perform the operation in the same manner as the first input/output circuit 9. Specifically, the operation for changing the values of the register takes place using a count up/down signal in accordance with phase comparison performed by the phase comparator 18a. This operation allows matching the phase of the receiver output 21d to the phase of the delay clock from the delay circuit 8, so that the CDR 19a can accurately sample data of the receiver output 21d in accordance with the delay clock.

In the interface part, the odd-numbered TXP and TXN output terminals 43 and 44 are electrically connected, externally of the chip, to the RXP and RXN input terminals 4 and 5, respectively, of the even-numbered RX 57. Even-numbered TXN and TXP output terminals 45 and 46 are electrically connected, externally of the chip, to the RXP and RXN input terminals 2 and 3, respectively, of the odd-numbered RX 56.

The odd-numbered TX output circuit 55 includes the PISO 40, the driver 42, and the selector 47. During normal operation, the odd-numbered TX output circuit 55 receives input of the PLL clock 28 through the selector 47. The PISO 40 converts parallel data into serial data in synchronization with the PLL clock 28, and the driver 42 transfers the serial data to the RXP and RXN input terminals 4 and 5 of the even-numbered RX 57 through the TXP and TXN output terminals 43 and 44.

When built-in test mode is selected, the PISO 40 converts the parallel data 49 into serial data in synchronization with the delay clock transferred from the delay circuit 7 of the odd-numbered RX 56 adjacent to the odd-numbered TX output circuit 55, for example. The driver 42 transfers the serial data to the RXP and RXN input terminals 4 and 5 of the even-numbered RX 57 through the TXP and TXN output terminals 43 and 44.

In the built-in test mode, the built-in test circuit 15 sets the register 12 of the odd-numbered RX 56 to a predetermined value (e.g., "5") so that the phase of the delay clock from the delay circuit 7 lags the phase of the PLL clock 28 by a value equivalent to the register value "5".

The PISO 40 receives input of the delay clock through the selector 47, and the PISO 40 converts the parallel data 49 into serial data in synchronization with the delay clock and transmits the serial data to the driver 42. The driver 42 transfers the serial data to the RXP and RXN input terminals 4 and 5 of the even-numbered RX 57 through the TXP and TXN output terminals 43 and 44.

In the built-in test mode, the even-numbered RX 57 set in a normal operation mode performs the interface function which involves extracting a clock phase component from superimposed data transferred from the odd-numbered TX output circuit 55, and capturing data in synchronization with the phase.

While maintaining the odd-numbered TX output circuit 55 and the even-numbered RX 57 in self test mode and normal operation mode, respectively, the built-in test circuit 15 compares a parallel data row transferred to the odd-numbered TX output circuit 55 to a parallel data row returned after making a round of the SIPO 20 of the even-numbered RX 57. A parallel data match verifies the interface function, that is, that the even-numbered RX 57 properly captures the data from the odd-numbered TX output circuit 55 at the register value "5". Then, the built-in test result 24 can be transferred to an external device through a predetermined terminal.

The built-in test mode is used to repeatedly verify the interface function, while changing the values of the register of the even-numbered RX 57 so that the register has varying values between the minimum value (the initial value) and the maximum value (the final value). More specifically, the superimposed data transferred from the odd-numbered TX output circuit 55 makes a round of a phase plane. Moreover the register value indicating the value of delay of the even-numbered RX 57 makes a round of a phase plane.

Therefore, in the built-in test mode, the even-numbered RX 57 properly transmits the superimposed data transferred from the odd-numbered TX output circuit 55 at all register values, and this verifies that the even-numbered RX 57 can properly capture the superimposed data in all phase planes. Then, the built-in test result 24 can be transferred to an external device through a predetermined terminal.

Furthermore, the same built-in test mode can be, of course, used to repeatedly verify the interface function on the even-numbered TX output circuit 58 and the first input/output circuit 9 of the odd-numbered RX 56 shown in FIG. 6 so as to test parallel data for all phases.

FOURTH EXAMPLE

Figure 7:
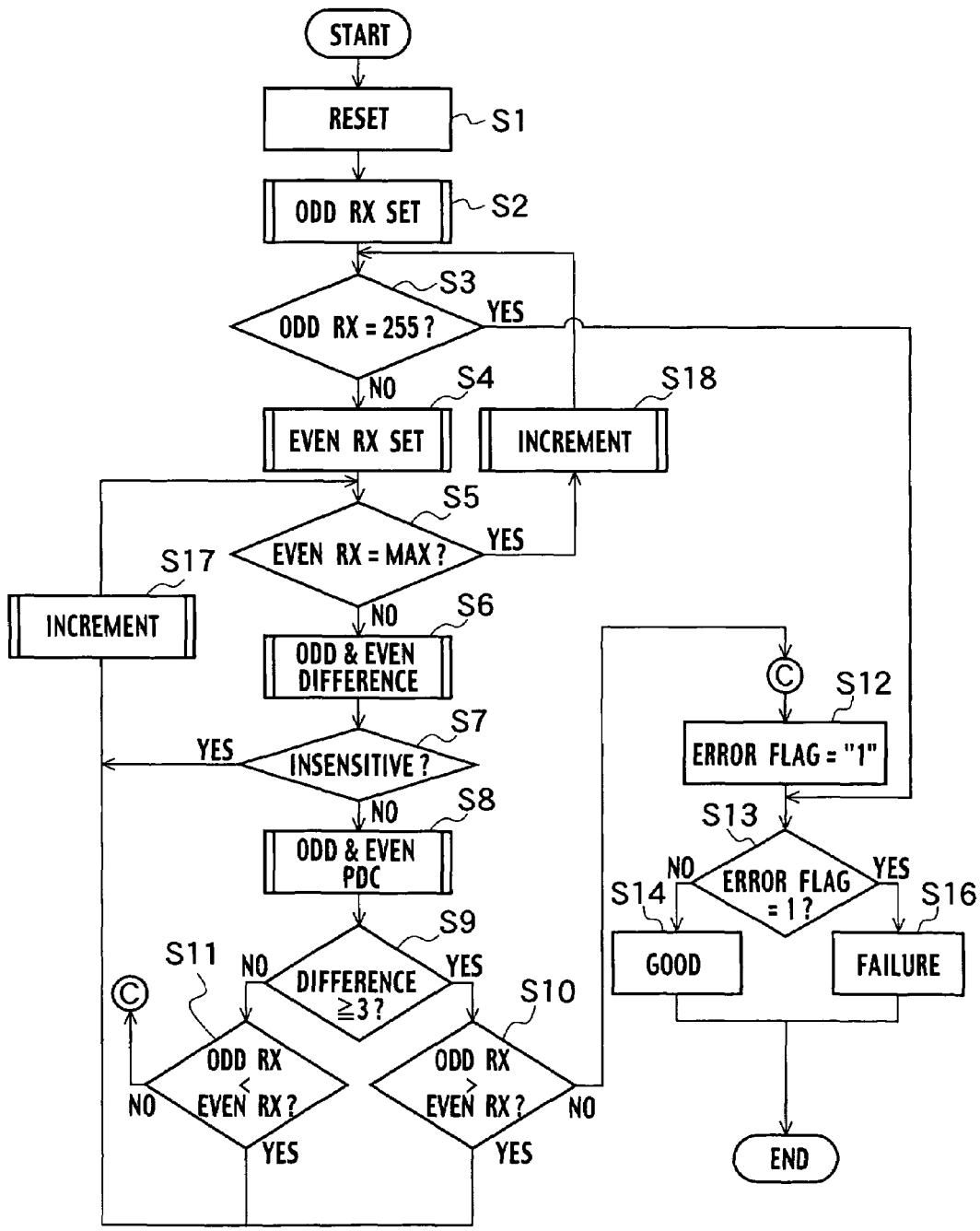
FIG. 7 is a flowchart of a method for testing a semiconductor integrated circuit according to a fourth example of the invention.
Figure 8:
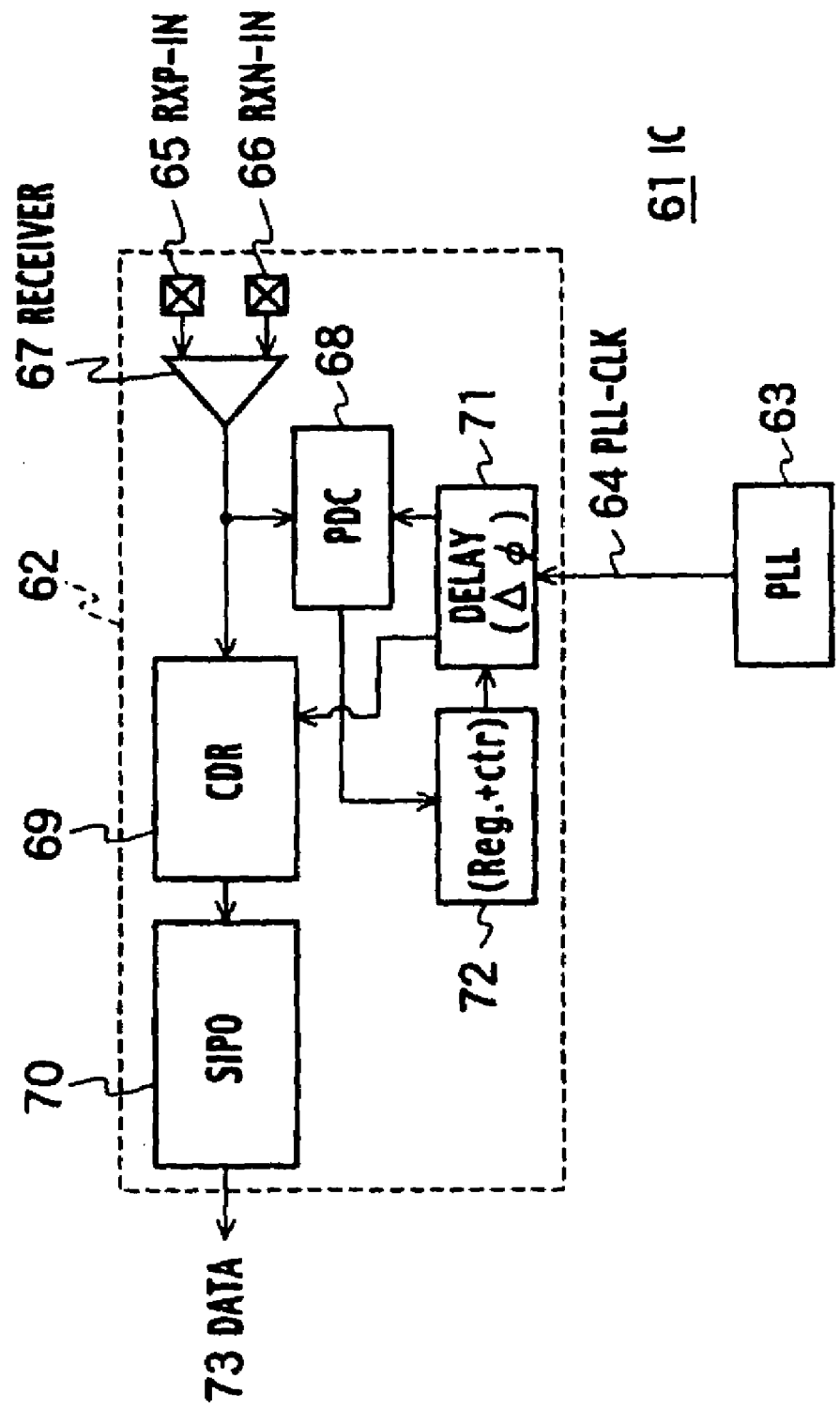
FIG. 8 is a block diagram of a conventional semiconductor integrated circuit.

FIG. 7 is a flowchart of a method for testing a semiconductor integrated circuit according to a fourth example of the invention. A semiconductor integrated circuit test includes the step of comparing phases (step S8), the steps of determining whether or not the phase of the odd-numbered RX delay clock leads the phase of the even-numbered RX delay clock (steps S10 and S11), and the step of determining an error flag (step S13) as a built-in test.

When the semiconductor integrated circuit test is started, processing goes to the step of resetting an error flag (step S1), where an error flag is reset to, for example, "0". Then, the processing goes to step S2, where a value of the register of the odd-numbered RX input/output circuit is set to the initial value "0". The register may be appropriately set to the initial integral value "128", which is the midpoint of the maximum value "255" of the register of the odd-numbered RX input/output circuit.

Then, the processing goes to step S3, where determination is made as to whether or not the register of the odd-numbered RX input/output circuit is equal to the maximum value (the final value) "255" of the register of the odd-numbered RX input/output circuit. When the register is equal to "255" (Yes in step S3), the processing jumps to the step of determining an error flag (step S13). When the register is not equal to "255" (No in step S3), the processing goes to step S4.

In step S4, the even-numbered RX register is set to the initial value "0". When the register of the odd-numbered RX input/output circuit is set to the integral value "128", the even-numbered RX register, however, may be set to the initial value "126", which is less than "128".

Then, the processing goes to step S5, where determination is made as to whether or not the even-numbered RX register is equal to the maximum value (the final value) "255". When the even-numbered RX register is equal to the maximum value "255" (Yes in step S5), the processing goes to step S18, where the odd-numbered RX register is incremented. Then, the processing returns to step S3. When the even-numbered RX register is not equal to the maximum value (No in step S5), the processing goes to step S6, where a difference between the odd-numbered RX and even-numbered RX registers is calculated. Then, the processing goes to step S7.

In step S7, determination is made as to whether or not the result of calculation of step S6 belongs to the dead zone. For example, when the difference between the odd-numbered RX and even-numbered RX registers falls within "plus or minus 1", the determination is made that the result of calculation belongs to the dead zone (Yes in step S7), and the processing goes to step S17, where the even-numbered RX register is incremented. Then, the processing returns to step S5. When the difference between the RX registers lies outside "plus or minus 1", the determination is made that the result of calculation is not in the dead zone (No in step S7), and the processing goes to step S8.

In step S8, the phase of the odd-numbered delay clock is compared to the phase of the even-numbered delay clock. Then, the processing goes to step S9, where determination is made as to whether or not the difference between the registers is equal to or more than "3". When the difference is equal to or more than "3" (Yes in step S9), the processing goes to step S10. When the difference is less than "3" (No in step S9), the processing goes to step S11.

In step S10, determination is made as to whether or not the phase of the odd-numbered RX delay clock leads the phase of the even-numbered RX delay clock. When the phase of the odd-numbered RX delay clock leads the phase of the even-numbered RX delay clock (Yes in step S10), the processing returns to step S5 via step S17. When the phase of the odd-numbered RX delay clock does not lead the phase of the even-numbered RX delay clock (No in step S10), the processing goes to step S12 via a node C.

In step S11, determination is made as to whether or not the phase of the odd-numbered RX delay clock lags the phase of the even-numbered RX delay clock. When the phase of the odd-numbered RX delay clock lags the phase of the even-numbered RX delay clock (Yes in step S11), the processing returns to step S5 via step S17. When the phase of the odd-numbered RX delay clock does not lag the phase of the even-numbered RX delay clock (No in step S11), the processing goes to step S12 via the node C.

In step S12, the error flag is set to "1". Then, the processing goes to the step of determining an error flag (step S13). In step S13, determination is made as to whether or not the error flag is equal to "1". When the error flag is equal to "1" (Yes in step S13), the processing goes to step S16. When the error flag is not equal to "1" (No in step S13), the processing goes to step S14.

Step S14 is executed in situations where the processing goes to step S13 when the odd-numbered RX register is equal to the maximum value (the final value) "255" or the odd-numbered RX register reaches the final value "127", starting at the initial value "128". In step S14, the determination is made that the semiconductor integrated circuit is non-defective, and the result of the determination is transferred from the built-in test circuit 15 to an external device. That the odd-numbered RX register is equal to the maximum value "255" means that the semiconductor integrated circuit is non-defective. Then, the test is ended, and the built-in test result is transferred to an external device through a predetermined terminal.

Step S16 is executed in situations where the processing goes to step S12 when there is a malfunction in a phase difference in the odd-numbered RX or even-numbered RX register. In step S16, the determination is made that the semiconductor integrated circuit is defective, and the result of the determination is transferred from the built-in test circuit 15 to an external device. That there is a malfunction in a phase difference in the odd-numbered RX or even-numbered RX register means that the semiconductor integrated circuit is defective. Then, the test is ended, and the built-in test result is transferred to an external device through a predetermined terminal.

The built-in test according to the fourth example further includes the step of placing a predetermined integral value X "0" into the odd-numbered RX register which acts as a first register for use in phase adjustment, and placing the value X+α "1", that is, the integral value X "0" plus a predetermined integral value α "1", into the even-numbered RX register which acts as a second register for use in phase adjustment.

Then, phase comparison takes place in step S8, where the phase comparator (e.g., the phase comparator 11 shown in FIG. 1) compares the phase of a delay clock transferred from a first clock delay circuit (i.e., the odd-numbered RX input/output circuit) to the phase of a delay clock transferred from a second clock delay circuit (i.e., the even-numbered RX input/output circuit).

Then, the value α is incremented or decremented in step S17. Then, the phase comparator (e.g., the phase comparator 11 shown in FIG. 1) compares the phase of the delay clock transferred from the first clock delay circuit (i.e., the odd-numbered RX input/output circuit) to the phase of the delay clock transferred from the second clock delay circuit (i.e., the even-numbered RX input/output circuit).

When the result of comparison is equal to an expected value prestored in the phase comparator, the determination is made that "a match occurs". When the result of comparison is not equal to the expected value, the determination is made that "a mismatch occurs" in step S10 or S11.

The test may be implemented in the following manner. The step of determining whether or not the phase of the odd-numbered RX delay clock leads the phase of the even-numbered RX delay clock (step S10 or S11) is repeated. Then, when the value α is more than a predetermined integral value β "254" and the determination is made that "a match occurs" in all instances, the processing goes to step S14, where the determination is made that the semiconductor integrated circuit is non-defective. When the determination is made that "a mismatch occurs" in at least one instance, the processing goes to step S16, where the determination is made that the semiconductor integrated circuit is defective.

OTHER EMBODIMENTS

As discussed above, it is to be understood that the functions and affects discussed in the description of the examples of the invention are only exemplary of expected functions and affects derived from the invention, and the functions and affects of the invention are not limited to those discussed in the description of the embodiment of the invention.

Specific examples of other functions and affects are given below. As illustrated in FIG. 2, the semiconductor integrated circuit 1, which receives the external signals 17 and 17a (i.e., embedded clocks) each containing data and a clock superimposed thereon, can include the first and second input circuits 19 and 19a. Also, the circuit 1 may include the phase comparator 11 which compares the phase of the delay clock from the delay circuit 7 of the first input circuit 19 to the phase of the delay clock from the delay circuit 8 of the second input circuit 19a; the register 12 which stores the value of delay of the delay circuit 7 which controls the first input circuit 19; the register 13 which stores the value of delay of the delay circuit 8 which controls the second input circuit 19a; and the built-in test circuit 15 including the controller 14 which changes the values of the register 13.

As illustrated in FIG. 4, the semiconductor integrated circuit 1, which receives the external signals 17 and 17a each containing data and a clock superimposed thereon, can include the input circuit 19; the PLL 16; the phase comparator 11 which compares the phase of the delay clock from the delay circuit 7 that controls the input circuit 19 to the phase of the delay clock from the delay circuit 8 connected to the PLL 16; the register 12 which stores the value of delay of the delay circuit 7; the register 13 which stores the value of delay of the delay circuit 8; and the controller 14 which changes the values of the register 13.

As illustrated in FIG. 2, the semiconductor integrated circuit 1 can include the built-in test circuit 15 including the memory area 25. In the semiconductor integrated circuit 1, a predetermined integral value X (e.g., one of values between "0" and "255" inclusive) is placed in the register 12 for use in phase adjustment of the first input circuit 19. The value X+α, that is, the integral value X plus a predetermined integral value α (e.g., one of values between "1" and "5" inclusive), is placed in the register 13 for use in phase adjustment of the second input circuit 19a. The phase comparator 11 compares the phase of the delay clock transferred from the delay circuit 7 to the phase of the delay clock transferred from the delay circuit 8. The result of comparison is stored in the memory area 25.

As illustrated in FIG. 4, the semiconductor integrated circuit 1 can include the built-in test circuit 15 including the memory area 25. In the semiconductor integrated circuit 1, a predetermined integral value X (e.g., one of values between "0" and "255" inclusive) is placed in the register 13 for use in phase adjustment, and connected to the PLL 16. The value X+α, that is, the integral value X plus a predetermined integral value α (e.g., one of values between "1" and "5" inclusive), is placed in the register 12 for use in phase adjustment of the delay circuit 7 disposed on the side of the input circuit 19. The phase comparator 11 compares the phase of the delay clock transferred from the delay circuit 8 to the phase of the delay clock transferred from the delay circuit 7 disposed on the side of the input circuit 19. The result of comparison is stored in the memory area 25.

As illustrated in FIG. 2, the semiconductor integrated circuit 1 can include the built-in test circuit 15 including the memory area 25. In the semiconductor integrated circuit 1, the registers 12 and 13 are used for phase adjustment of a pair of the input circuits 19 and 19a, respectively. A predetermined integral value X is placed in the register 12 for use in phase adjustment of the input circuit 19. The value X+α, that is, the integral value X plus a predetermined integral value α, is placed in the register 13 for use in phase adjustment of the input circuit 19a. The phase comparator 11 compares the phase of the delay clock transferred from the delay circuit 7 for use in phase adjustment of the input circuit 19 to the phase of the delay clock transferred from the delay circuit 8 for use in phase adjustment of the input circuit 19a. The comparison result is stored in the memory area 25. While incrementing or decrementing the value α, the phase comparator 11 compares the phase of the delay clock transferred from the delay circuit 7 for use in phase adjustment of the input circuit 19 to the phase of the delay clock transferred from the delay circuit 8 for use in phase adjustment of the input circuit 19a. The comparison result is stored in the memory area 25. While changing the value α, the phase comparator 11 performs phase comparison. The comparison results are sequentially stored in the memory area 25.

As illustrated in FIG. 4, the semiconductor integrated circuit 1 can include the built-in test circuit 15 including the memory area 25 and the storing mechanism. In the semiconductor integrated circuit 1, a predetermined integral value X (e.g., one of values between "0" and "255" inclusive) is placed in the register 13 for use in phase adjustment, connected to the PLL 16. The value X+α, that is, the integral value X plus a predetermined integral value α (e.g., one of values between "1" and "5" inclusive), is placed in the register 12 for use in phase adjustment of the delay circuit 7 disposed on the side of the input circuit 19. The phase comparator 11 compares the phase of the delay clock transferred from the delay circuit 8 to the phase of the delay clock transferred from the delay circuit 7 disposed on the side of the input circuit 19. The comparison result is stored in the memory area 25. While changing the value α, the phase comparator 11 compares the phase of the delay clock transferred from the delay circuit 8 for use in phase adjustment to the phase of the delay clock transferred from the delay circuit 7 for use in phase adjustment of the input circuit 19. The comparison result is stored in the memory area 25. While changing the value α, the phase comparator 11 performs phase comparison. The comparison result are sequentially stored in the storing mechanism.

The semiconductor integrated circuit test of the embodiment can be implemented as illustrated in FIG. 2. More specifically, a predetermined integral value X is placed in the register 12 for use in phase adjustment of the input circuit 19. The value X+α, that is, the integral value X plus a predetermined integral value α, is placed in the register 13 for use in phase adjustment of the input circuit 19a. The phase comparator 11 compares the phase of the delay clock transferred from the delay circuit 7 for use in phase adjustment of the input circuit 19 to the phase of the delay clock transferred from the delay circuit 8 for use in phase adjustment of the input circuit 19a. When the comparison result is equal to a prestored expected value, the determination is made that "a match occurs". When the comparison result is not equal to the expected value, the determination is made that "a mismatch occurs". Information indicating that "a match occurs" or "a mismatch occurs" is stored in the memory area 25. The phase comparator 11 performs phase comparison while changing the value α, and the comparison results are stored in the memory area 25. This operation is repeatedly performed. When the value α is more than a predetermined integral value β and the determination is made that "a match occurs" in all instances, the determination is made that a semiconductor integrated circuit is not defective. When the determination is made that "a mismatch occurs" in at least one instance, the determination is made that the semiconductor integrated circuit is defective.

The semiconductor integrated circuit test of the invention can be implemented as illustrated in FIG. 4. More specifically, a predetermined integral value X is placed in the register 12 for use in phase adjustment of the input circuit 19. The value X+α, that is, the integral value X plus a predetermined integral value α, is placed in the register 13 for use in phase adjustment on the side of the PLL 16. The phase comparator 11 compares the phase of the delay clock transferred from the delay circuit 7 for use in phase adjustment of the input circuit 19 to the phase of the delay clock transferred from the delay circuit 8 for use in phase adjustment on the side of the PLL 16. When the comparison result is equal to a prestored expected value, the determination is made that "a match occurs". When the comparison result is not equal to the expected value, the determination is made that "a mismatch occurs". Information indicating that "a match occurs" or "a mismatch occurs" is stored. The phase comparator 11 performs phase comparison while changing the value α, and the comparison results are stored in the memory area 25. This operation is repeatedly performed. When the value α is more than a predetermined integral value β and the determination is made that "a match occurs" in all instances, the determination is made that a semiconductor integrated circuit is not defective. When the determination is made that "a mismatch occurs" in at least one instance, the determination is made that the semiconductor integrated circuit is defective.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor integrated circuit, comprising:
a first input circuit configured to receive a first input signal superimposing first data and a clock:
a first delay circuit connected to the first input circuit, the first delay circuit generating a first delay clock and supplying the first delay clock to the first input circuit so that the first input circuit samples the first data from the first input signal in synchronization with the first delay clock:
a second input circuit configured to receive a second input signal superimposing second data and a clock;
a second delay circuit connected to the second input circuit, the second delay circuit generating a second delay clock and supplying the second delay clock to the second input circuit so that the second input circuit samples the second data from the second input signal in synchronization with the second delay clock;
a first register connected to the first delay circuit to register a value of a first delay of the first delay clock;
a second register connected to the second delay circuit to register a value of a second delay of the second delay clock;
a clock supplying circuit connected to the first and second delay circuits and supplying a clock signal to the first and second delay circuits;
a phase comparator connected to the first and second delay circuits to detect a phase difference between the first and second delay clocks; and
a built-in test circuit configured to control the first and second registers so that the value of the first delay can be registered in the first register and the value of the second delay can be registered in the second register,
wherein the phase difference is compared with a test data in order to determine whether the first and second registers and the first and second delay circuits operate correctly.

2. The semiconductor integrated circuit of claim 1, wherein when initial values of the first and second delays are registered in the first and second register, the phase comparator compares phases of the first and second delay clocks until the value of the first delay is a final value while the value of the second delay is fixed.

3. The semiconductor integrated circuit of claim 1, wherein when an initial value of the second delay is registered in the second register, the phase comparator compares phases of the first and second delay clocks until the value of the second delay is a final value while the value of the first delay is fixed.

4. The semiconductor integrated circuit of claim 1, wherein when initial values of the first and second delays are registered in the first and second register, the phase comparator compares phases of the first and second delay clocks until the value of the first delay is a final value while the value of the second delay is the initial value of the second delay up to a final value.

5. The semiconductor integrated circuit of claim 1, wherein when initial values of the first and second delays are registered in the first and second register, the phase comparator compares phases of the first and second delay clocks until the value of the second delay is a final value while the value of the first delay is the initial value of the first delay up to a final value.

6. The semiconductor integrated circuit of claim 1, wherein the built-in test circuit comprises a memory area storing a comparative result of the phase comparator.

7. A semiconductor integrated circuit, comprising:
a first input circuit having a first delay circuit;
a second input circuit having a second delay circuit;
a first output circuit having an output connected to an input of the first input circuit;
a second output circuit having an output connected to an input of the second input circuit;
a clock supplying circuit supplying a clock signal through the first delay circuit directly to the second output circuit and the first input circuit and supplying the clock signal through the second delay circuit directly to the first output circuit and the second input circuit;and
a built-in test circuit connected to the first and second input circuits and the first and second output circuits to test a phase difference based on a first test result received from the first input circuit and based on a second test result received from the second input circuit, wherein
the first input circuit is configured to receive a first input signal containing a first data and the clock delayed by the second delay circuit, the first input signal provided from the output of the first output circuit to the input of the first input circuit.
the second input circuit is configured to receive a second input signal containing a second data and the clock delayed by the first delay circuit, the second input signal provided from the output of the second output circuit to the input of the second input circuit, and
the first input circuit samples the first data from the first input signal in synchronization with the clock signal supplied through the first delay circuit and the second input circuit samples the second data from the second input signal in synchronization with the clock signal supplied through the second delay circuit.

8. The semiconductor integrated circuit of claim 7, wherein the built-in test circuit supplies a first test data to the first output circuit and supplies a second test data to the second output circuit.

9. The semiconductor integrated circuit of claim 7, wherein
the first input circuit includes a first register;
the second input circuit includes a second register; and
the built-in test circuit writes an initial value of a first delay in the first register controlling the first delay circuit, and testing the first register until the value of the first delay is a final value while a value of a second delay stored in the second register controlling the second delay circuit is fixed.

10. The semiconductor integrated circuit of claim 7, wherein
the first input circuit includes a first register;
the second input circuit includes a second register; and
the built-in test circuit writes an initial value of a second delay in the second register controlling the second delay circuit, to test the second register until the value of the second delay is a final value while a value of a first delay stored in the first register controlling the first delay circuit is fixed.

11. The semiconductor integrated circuit of claim 7, wherein
the first input circuit includes a first register;
the second input circuit includes a second register; and
the built-in test circuit writes an initial value of a first delay in the first register controlling the first delay circuit, writes an initial value of a second delay in the second register controlling the second delay circuit, and tests the phase difference until a value of the first delay is a final value while a value of the second delay is the initial value of the second delay up to a final value.

12. The semiconductor integrated circuit of claim 7, wherein
the first input circuit includes a first register;
the second input circuit includes a second register; and
the built-in test circuit writes an initial value of a first delay in the first register controlling the first delay circuit, writes an initial value of a second delay in the second register controlling the second delay circuit, and tests the phase difference until a value of the second delay is a final value while a value of the first delay is the initial value of the first delay up to a final value.

13. A method for testing a semiconductor integrated circuit, comprising:
generating a first delay clock from a first delay circuit;
supplying the first delay clock to a first input circuit so that the first input circuit samples first data from a first input signal, which superimposes the first data and a clock, in synchronization with the first delay clock;
generating a second delay clock from a second delay circuit;
supplying the second delay clock to a second input circuit so that the second input circuit samples second data from a second input signal, which superimposes the second data and a clock, in synchronization with the second delay clock
storing a value of a first delay of the first delay clock in a first register;
storing a value of a second delay of the second delay clock in a second register;
supplying a clock signal to the first and second delay circuits from a clock supplying circuit;
detecting a phase difference between the first and second delay clocks in a phase comparator; and
comparing the phase difference with a test data in order to determine whether the first and second registers and the first and second delay circuits operate correctly.

14. The method of claim 13, wherein storing a value of a first delay of the first delay clock in the first register comprises writing an initial value of the first delay in the first register, storing a value of a second delay of the second delay clock in the second register comprises writing an initial value of the second delay in the second register, and detecting a phase difference between the first and second delay clocks in a phase comparator comprises detecting the phase difference between the first and second delay clocks until the value of the first delay is a final value while the value of the second delay is fixed.

15. The method of claim 13, wherein storing a value of a second delay of the second delay clock in the second register comprises writing an initial value of the second delay in the second register, and detecting a phase difference between the first and second delay clocks in a phase comparator comprises detecting the phase difference between the first and second delay clocks until the value of the second delay is a final value while the value of the first delay is fixed.

16. The method of claim 13, wherein storing a value of a first delay of the first delay clock in the first register comprises writing an initial value of the first delay in the first register, storing a value of a second delay of the second delay clock in the second register comprises writing an initial value of the second delay in the second register, and detecting a phase difference between the first and second delay clocks in a phase comparator comprises detecting the phase difference between the first and second delay clocks until the value of the first delay is a final value while the value of the second delay is the initial value of the second delay up to a final value.

17. The method of claim 13, wherein storing a value of a first delay of the first delay clock in the first register comprises writing an initial value of the first delay in the first register, storing a value of a second delay of the second delay clock in the second register comprises writing an initial value of the second delay in the second register, and detecting a phase difference between the first and second delay clocks in a phase comparator comprises detecting the phase difference between the first and second delay clocks until the value of the second delay is a final value while the value of the first delay is the initial value of the first delay up to a final value.

18. The method of claim 13, wherein detecting a phase difference between the first and second delay clocks in a phase comparator comprises determining that the phase difference is in a dead zone of the phase comparator when a value of the first delay is substantially equal to a value of the second delay.

* * * * *